(12) United States Patent
Ha et al.

(10) Patent No.: US 12,325,222 B2
(45) Date of Patent: Jun. 10, 2025

(54) ELECTRONIC DEVICE

(71) Applicant: Samsung Display Co., Ltd., Yongin-si (KR)

(72) Inventors: Seunghwa Ha, Cheongju-si (KR); Sangjae Kim, Seongnam-si (KR); Sang Wol Lee, Yongin-si (KR); Seung-Ho Jung, Hwaseong-si (KR); In-Woo Jeong, Asan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 273 days.

(21) Appl. No.: 17/370,499

(22) Filed: Jul. 8, 2021

(65) Prior Publication Data

US 2022/0071026 A1    Mar. 3, 2022

(30) Foreign Application Priority Data

Sep. 2, 2020 (KR) .................. 10-2020-0111933

(51) Int. Cl.
| | |
|---|---|
| H05K 5/00 | (2006.01) |
| B32B 3/26 | (2006.01) |
| B32B 7/05 | (2019.01) |
| H01L 25/16 | (2023.01) |
| H10K 50/84 | (2023.01) |
| B32B 15/08 | (2006.01) |
| H05K 7/20 | (2006.01) |
| H10K 102/00 | (2023.01) |

(52) U.S. Cl.
CPC ............. *B32B 7/05* (2019.01); *B32B 3/266* (2013.01); *H01L 25/167* (2013.01); *H10K 50/841* (2023.02); *B32B 15/08* (2013.01); *B32B 2307/416* (2013.01); *B32B 2457/20* (2013.01); *H05K 7/20963* (2013.01); *H10K 2102/311* (2023.02)

(58) Field of Classification Search
None
See application file for complete search history.

(56) References Cited

U.S. PATENT DOCUMENTS

| | | | |
|---|---|---|---|
| 9,923,156 B2 | 3/2018 | Jeong | |
| 10,429,895 B2 | 10/2019 | Lee | |
| 10,446,719 B2 | 10/2019 | Bower et al. | |
| 10,541,372 B2 | 1/2020 | Momma et al. | |
| 10,725,498 B2 | 7/2020 | Han et al. | |

(Continued)

FOREIGN PATENT DOCUMENTS

| | | |
|---|---|---|
| CN | 107731790 | 2/2018 |
| CN | 107887338 | 4/2018 |

(Continued)

*Primary Examiner* — Anthony J Frost
(74) *Attorney, Agent, or Firm* — KILE PARK REED & HOUTTEMAN PLLC

(57) ABSTRACT

An electronic device includes a display panel including non-folding areas and a folding area disposed between the non-folding areas, a lower protective film disposed below the display panel, an external light reflective member disposed below the lower protective film, a lower member disposed below the external light reflective member, and cushion members disposed below the lower member. The display panel is foldable along a folding axis. The cushion members are spaced apart from each other and define a cushion hole in the folding area.

23 Claims, 10 Drawing Sheets

(56) References Cited

U.S. PATENT DOCUMENTS

| | | | |
|---|---|---|---|
| 11,096,293 B2 | 8/2021 | Park et al. | |
| 11,217,769 B2 | 1/2022 | Kishimoto et al. | |
| 2011/0121356 A1* | 5/2011 | Krawinkel | C09J 153/025 |
| | | | 257/E33.059 |
| 2017/0054106 A1* | 2/2017 | Jeon | H10K 77/111 |
| 2017/0141168 A1* | 5/2017 | Choi | H10K 77/111 |
| 2018/0090702 A1* | 3/2018 | Um | H10K 50/844 |
| 2018/0103553 A1* | 4/2018 | Kim | G02B 5/20 |
| 2019/0352790 A1 | 11/2019 | Deodhar et al. | |
| 2020/0022267 A1 | 1/2020 | Han et al. | |

FOREIGN PATENT DOCUMENTS

| | | |
|---|---|---|
| CN | 109994044 | 7/2019 |
| CN | 111105709 | 5/2020 |
| JP | 5907722 | 4/2016 |
| KR | 10-0824008 | 4/2008 |
| KR | 10-2018-0018972 | 2/2018 |
| KR | 10-2019-0040518 | 4/2019 |
| KR | 10-2019-0082339 | 7/2019 |
| KR | 10-2020-0006646 | 1/2020 |

* cited by examiner

ELECTRONIC DEVICE

CROSS-REFERENCE TO RELATED APPLICATION(S)

This application claims priority to and benefits of Korean Patent Application No. 10-2020-0111933 under 35 U.S.C. § 119, filed on Sep. 2, 2020 in the Korean Intellectual Property Office, the entire contents of which are incorporated herein by reference.

BACKGROUND

The disclosure herein relates to a foldable electronic device.

Electronic devices generally include an active area that is activated in response to or in accordance with electrical signals. In the electronic devices, an input can be applied from the outside through the active area and various images can be displayed to provide information to a user. Such electronic devices have been developed to have various shapes, and also the active areas have been developed to have various shapes to be compatible with those of the electronic devices.

SUMMARY

The disclosure provides is to provide an electronic device in which a cushion layer is disposed under a lower member including a metal to increase in rigidity.

In an embodiment an electronic device may include a display panel including non-folding areas and a folding area disposed between the non-folding areas, the display panel being foldable along a folding axis; a lower protective film disposed below the display panel; an external light reflective member disposed below the lower protective film; a lower member disposed below the external light reflective member; and cushion members disposed below the lower member. The cushion members may be spaced apart from each other and may define a cushion hole in the folding area.

In an embodiment, the external light reflective member may have a black color.

In an embodiment, the external light reflective member may include a barrier film disposed on the lower member; a first barrier adhesive layer disposed between the barrier film and the lower protective film to bond the barrier film to the lower protective film; and a second barrier adhesive layer disposed between the barrier film and the lower member to bond the barrier film to the lower member.

In an embodiment, the electronic device may further include an adhesive opening which overlaps the folding area and passes through the second barrier adhesive layer.

In an embodiment, the electronic device may include a film opening which overlaps the adhesive opening and passes through the barrier film.

In an embodiment, the external light reflective member may include a base layer that overlaps the lower member and comprises aluminum; and an adhesive layer disposed between the base layer and the lower protective film to bond the barrier film to the lower protective film.

In an embodiment, the electronic device may further include a base opening which overlaps the folding area and passes through the base layer.

In an embodiment, the electronic device may further include an adhesive opening which overlaps the base opening and passes through the adhesive layer.

In an embodiment, the lower member may include a first lower member disposed below the external light reflective member and comprising at least one of stainless steel and an aluminum alloy; and a second lower member disposed between the cushion members and the first lower member, and at least one lower opening may overlap the folding area and may pass through the first lower member.

In an embodiment, the second lower member may include at least one of a lower plate, a heat dissipation sheet, and an insulating film. The lower plate may prevent the at least one lower opening from being deformed.

In an embodiment, an electronic device may include a display panel including a first area, a second area, and a third area, which are arranged in a first direction; a lower protective film disposed below the display panel; a lower member disposed below the display panel, cushion members disposed below the lower member; and an external light reflective member disposed between the lower protective film and the lower member. The second area may be foldable along a folding axis extending in a second direction intersecting the first direction, and the external light reflective member may have a black color.

In an embodiment, the cushion members may be spaced apart from each other and define a cushion hole in the second area.

In an embodiment, the external light reflective member may include a barrier film disposed on the lower member; a first barrier adhesive layer disposed between the barrier film and the lower protective film to bond the barrier film to the lower protective film; and a second barrier adhesive layer disposed between the barrier film and the lower member to bond the barrier film to the lower member.

In an embodiment, the electronic device may further include an adhesive opening which overlaps the second area and passes through the second barrier adhesive layer.

In an embodiment, the electronic device may further include a film opening which overlaps the adhesive opening and passes through the barrier film.

In an embodiment, the external light reflective member may include a base layer that overlaps the lower member and comprises aluminum; and an adhesive layer disposed between the base layer and the lower protective film to bond the barrier film to the lower protective film.

In an embodiment, the electronic device may further include a base opening which overlaps the second area and passes through the base layer.

In an embodiment, the electronic device may further include an adhesive opening which overlaps the base opening and passes through the adhesive layer.

In an embodiment, the lower member may include a first lower member disposed below the external light reflective member and comprising at least one of stainless steel and aluminum; and a second lower member disposed between the cushion members and the first lower member, and at least one lower opening may overlap the second area and may pass through the first lower member.

In an embodiment, the second lower member may include at least one of a lower plate, a heat dissipation sheet, and an insulating film. The lower plate may prevent the at least one lower opening from being deformed

BRIEF DESCRIPTION OF THE DRAWINGS

The accompanying drawings are included to illustrate embodiments of the disclosure and, together with the description, serve to explain the embodiments. In the drawings.

DETAILED DESCRIPTION OF THE EMBODIMENTS

Figure 1A:
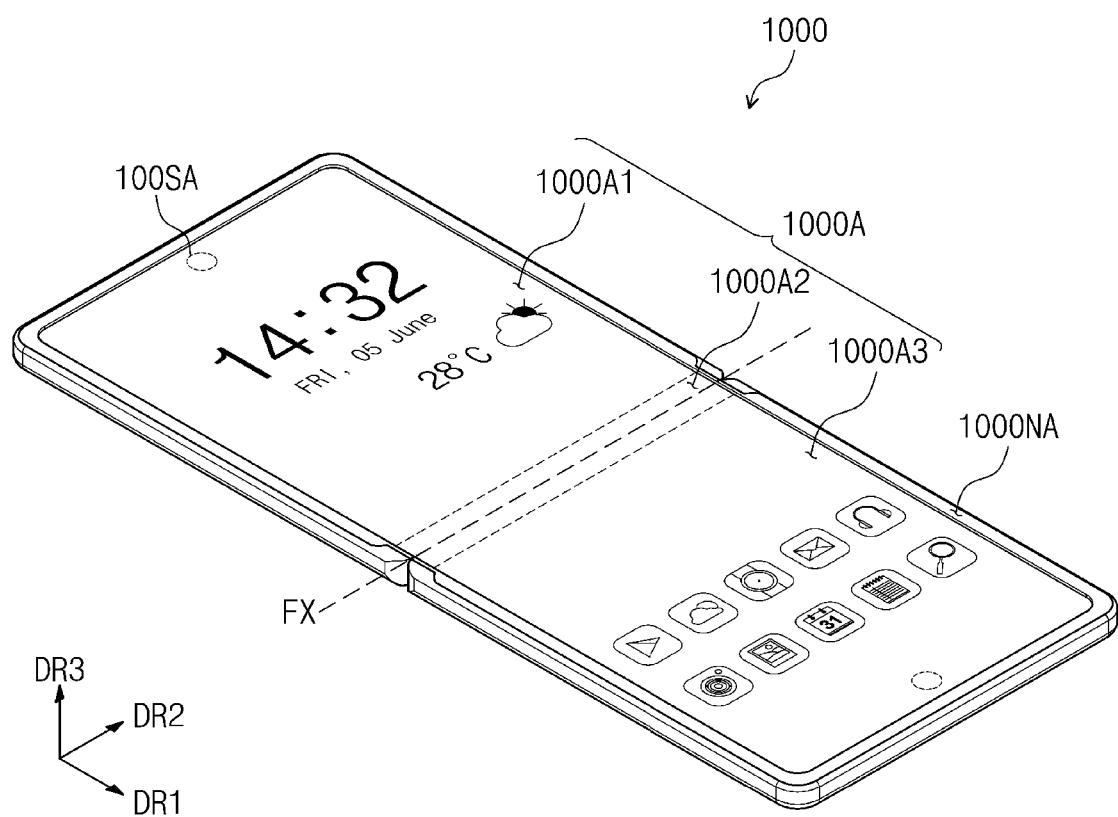
FIG. 1A is a schematic perspective view of an electronic device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In this specification, it will also be understood that when one component (or region, layer, portion, etc.) is referred to as being 'on,' 'connected to,' or 'coupled to' another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims. The terms of a singular form may include plural forms unless referred to the contrary.

Also, "under," "below," "above," "upper," and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this disclosure belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component, or a combination thereof, but does not exclude other properties, fixed numbers, steps, operations, elements, components, or combinations thereof. Hereinafter, embodiments will be described with reference to the accompanying drawings.

Figure 1B:
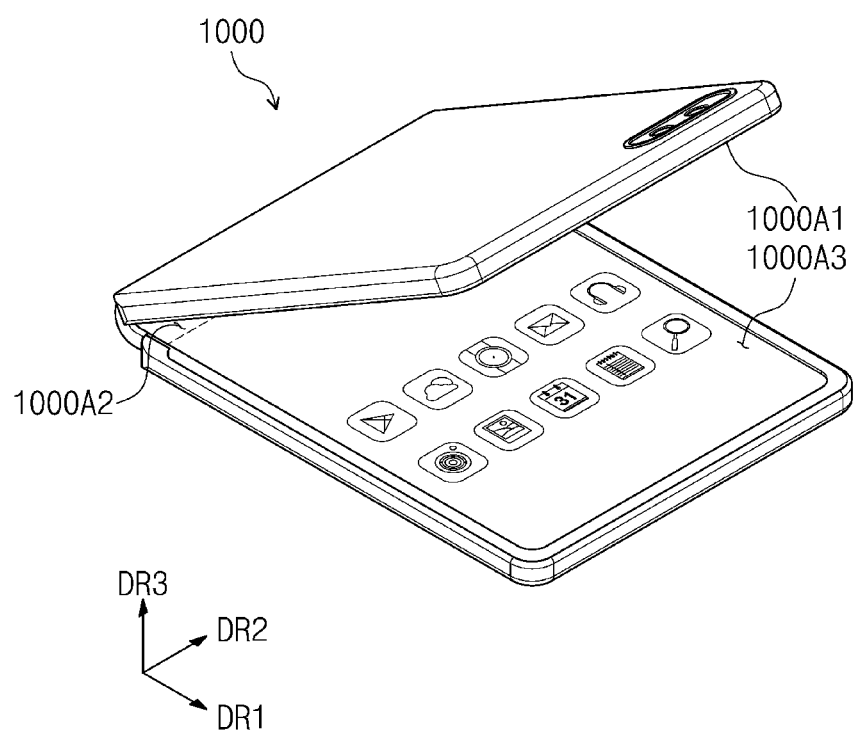
FIG. 1B is a schematic perspective view of an electronic device according to an embodiment.
Figure 2:
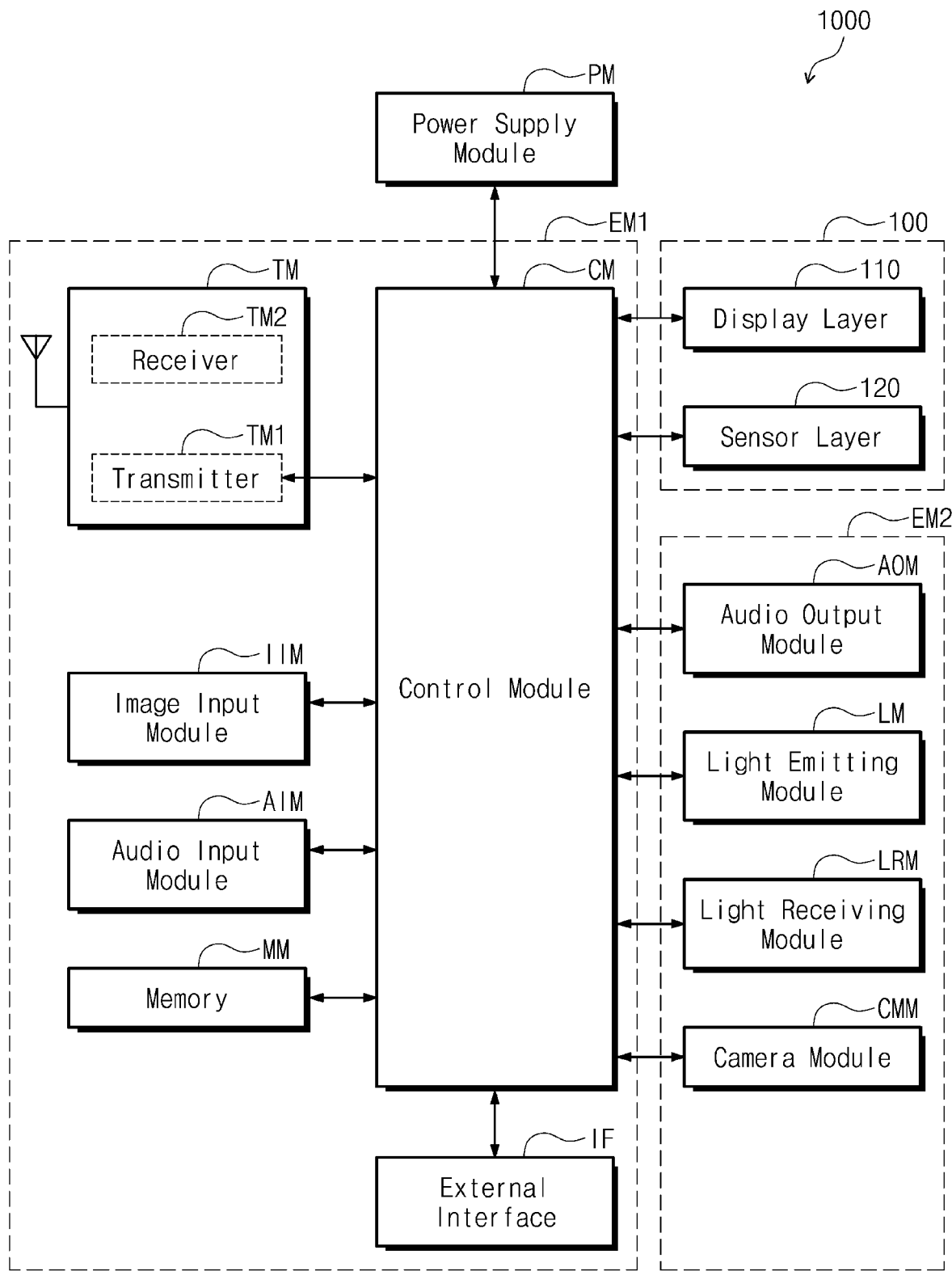
FIG. 2 is a block diagram of the electronic device according to an embodiment.
Figure 3A:
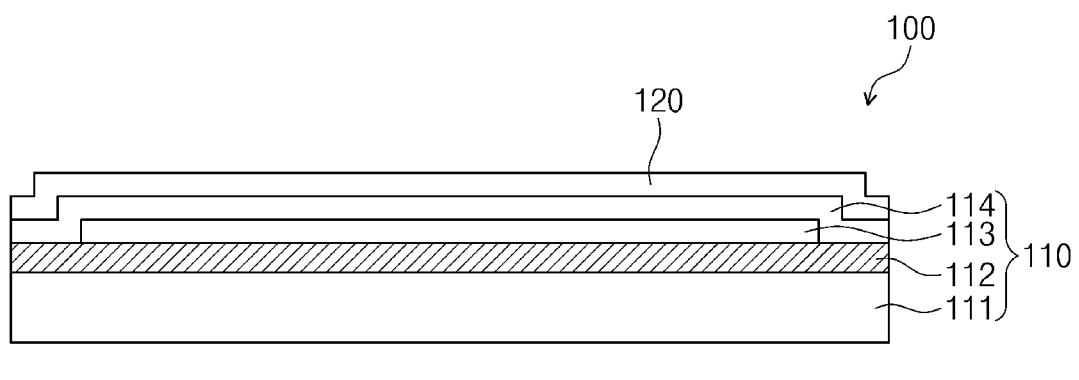
FIG. 3A is a schematic cross-sectional view of a display layer according to an embodiment.
Figure 3B:
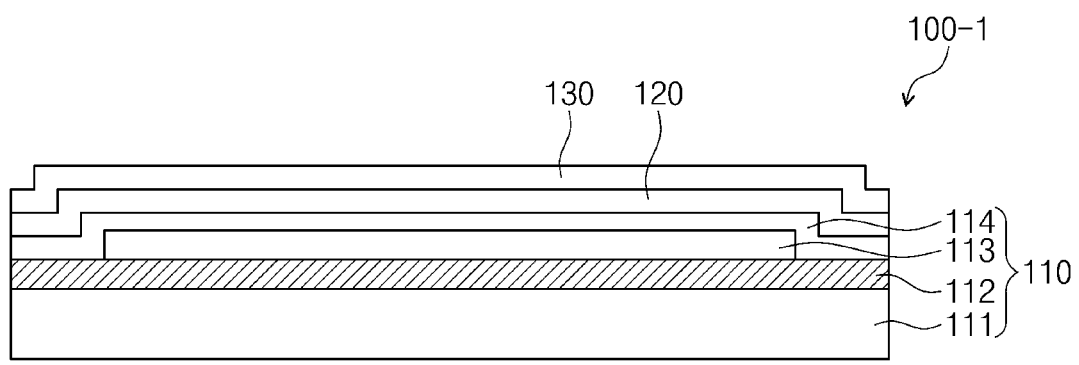
FIG. 3B is a schematic cross-sectional view of a display layer according to an embodiment.

FIG. 1A schematic is a perspective view of an electronic device according to an embodiment. FIG. 1B is a schematic perspective view of an electronic device according to an embodiment. FIG. 2 is a block diagram of the electronic device according to an embodiment. FIG. 3A is a schematic cross-sectional view of a display layer according to an embodiment. FIG. 3B is a schematic cross-sectional view of a display layer according to an embodiment.

FIG. 1A is a schematic perspective view of an electronic device according to an embodiment. FIG. 1B is a schematic perspective view of an electronic device according to an embodiment. FIG. 2 is a block diagram of the electronic device according to an embodiment.

Referring to FIGS. 1A and 1B, the electronic device 1000 may be a device that is activated according to an electrical signal. For example, the electronic device 1000 may be a mobile phone, a tablet PC, a car navigation system, a game console, or a wearable device, but is not limited thereto. FIG. 1A illustrates an example in which the electronic device 1000 is provided as the mobile phone.

The electronic device 1000 may display an image through an active area 1000A. In a state in which the electronic device 1000 is unfolded, the active area 1000A may include a plane defined by a first direction DR1 and a second direction DR2. A thickness direction of the electronic device 1000 may be parallel to a third direction DR3 intersecting the first direction DR1 and the second direction DR2. Thus, a front surface (or top surface) and a rear surface (or bottom surface) of each of members constituting the electronic device 1000 may be defined based on the third direction DR3.

The active area 1000A may include a first area 1000A1, a second area 1000A2, and a third area 1000A3. The second area 1000A2 may be folded with respect to a folding axis FX extending along the second direction DR2. Thus, the first area 1000A1 and the third area 1000A may be referred to as non-folding areas, and the second area 1000A2 may be referred to as a folding area.

In case that the electronic device 1000 is folded, the first area 1000A1 and the third area 1000A3 may face each other. Thus, in the fully folded state, the active area 1000A may not be exposed to the outside, which may be referred to as in-folding. However, this is merely an example, and an operation of the electronic device 1000 is not limited thereto.

For example, in an embodiment, when the electronic device 1000 is folded, the first area 1000A1 and the third area 1000A3 may be opposite to each other. Thus, in the folded state, the active area 1000A may be exposed to the outside, which may be referred to as out-folding.

The electronic device 1000 may perform an in-folding operation or an out-folding operation. In an embodiment, the electronic device 1000 may perform both in-folding and out-folding operations. The same area of the electronic device 1000, for example, the second area 1000A2 may be in-folded and out-folded. In other embodiments, an area of the electronic device 1000 may be in-folded, and another area may be out-folded.

In FIGS. 1A and 1B, one folding area and two non-folding areas are illustrated as an example, but the number of folding and non-folding areas is not limited thereto. For example, the electronic device 1000 may include more than two folding areas, i.e., multiple non-folding areas and multiple folding areas disposed between the non-folding areas adjacent to each other.

FIGS. 1A and 1B illustrate that the folding axis FX is parallel to a short axis of the electronic device 1000, but the embodiment is not limited thereto. For example, the folding axis FX may extend along a long axis of the electronic device 1000, for example, in a direction parallel to the first direction DR1. The first area 1000A1, the second area 1000A2, and the third area 1000A3 may be sequentially arranged along the second direction DR2.

The electronic device 1000 may include a sensing area 100SA. At least one module requiring light may be disposed under the sensing area 100SA.

The sensing area 100SA may overlap a camera module and also may overlap a proximity illuminance sensor, but the embodiments are not limited thereto. The sensing area 100SA may be completely surrounded by the active area 1000A, and at least a portion of the sensing area 100SA may be surrounded, but is not limited to a specific embodiment.

Referring to FIG. 2, the electronic device 1000 according to an embodiment may include a display panel 100, a power supply module PM, a first electronic module EM1, and a second electronic module EM2. The display panel 100, the power supply module PM, the first electronic module EM1, and the second electronic module EM2 may be electrically connected to each other.

The display panel 100 may include a display layer 110 and a sensor layer 120. The display layer 110 may be a component that substantially generates an image. An image generated by the display layer 110 is visually recognized by a user from the outside through the active area 1000A.

The first electronic module EM1 and the second electronic module EM2 may include various functional modules for driving the electronic device 1000. The first electronic module EM1 may be mounted on a mother board electrically connected to the display panel 100 or may be mounted on a separate board and electrically connected to the mother board through a connector (not shown).

The first electronic module EM1 may include a control module CM, a wireless communication module TM, an image input module IIM, an audio input module AIM, a memory MM, and an external interface IF. A portion of the modules may not be mounted on the mother board but electrically connected to the mother board through a flexible circuit board.

The control module CM controls an overall operation of the electronic device 1000. The control module CM may include a microprocessor. For example, the control module CM may activate or inactivate the display panel 100. The control module CM may control other modules such as the image input module IIM or the audio input module AIM based on touch signals received from the display panel 100.

The wireless communication module TM may transmit/receive a wireless signal to/from the other terminal by using Bluetooth or Wi-Fi circuits. The wireless communication module TM may transmit/receive an audio signal by using a general communication circuit. The wireless communication module TM includes a transmitter TM1 modulating and transmitting a signal to be transmitted and a receiver TM2 demodulating the received signal.

The image input module IIM processes the image signal to convert the processed image signal into image data that is capable of being displayed on the display panel 100. The audio input module AIM receives external audio signals by using a microphone during recording mode or a voice recognition mode to convert the received audio signal into electrical sound data.

The external interface IF serves as an interface electrically connected to an external charger, a wired/wireless data port, and a card socket (for example, a memory card and an SIM/UIM card).

The second electronic module EM2 may include an audio output module AOM, a light emitting module LM, a light receiving module LRM, and a camera module CMM. The above-described components may be mounted on the mother board, may be mounted on a separate board, and electrically connected to the display panel 100 through a connector (not shown), or may be electrically connected to the first electronic module EM1.

The audio output module AOM converts audio data received from the wireless communication module TM or audio data stored in the memory MM to output the converted audio data to the outside.

The light emitting module LM generates and outputs light. The light emitting module LM may output infrared rays. For example, the light emitting module LM may include an LED element. For example, the light receiving module LRM may sense infrared rays. The light receiving module LRM may be activated when infrared rays having a predetermined level or more is sensed. The light receiving module LRM may include a CMOS sensor. The infrared rays generated in the light emitting module LM may be outputted and then be reflected by an external subject (for example, a user's finger or face), and the reflected infrared rays may be incident into the light receiving module LRM. The camera module CMM photographs an external image.

At least a portion of the electronic module according to an embodiment may be disposed under the display panel 100 to overlap the sensing area 100SA (refer to FIG. 1A). The electronic module may include at least one of the components of the first electronic module EM1 and the second electronic module EM2. For example, the electronic module may include at least one of the camera, the speaker, the optical detection sensor, and the thermal detection sensor.

The electronic module may sense an external object through the sensing area 100SA or provide a sound signal such as a voice to the outside through the sensing area 100SA. Also, the electronic module may include multiple components, but the embodiments are not limited thereto.

Although not shown, the electronic device 1000 according to an embodiment may further include a transparent member disposed between the electronic module and the display panel 100. The transparent member may be an optically transparent film that transmits external inputs that pass through the sensing area to the electronic module. The transparent member may be attached to the rear surface of the display panel 100 or be disposed between the display panel 100 and the electronic module without an adhesive layer. The electronic device 1000 according to an embodiment may have various shapes, but is not limited to any one embodiment.

According to an embodiment, the electronic module may be assembled to overlap the sensing area 100SA included in the active area 1000A in a plan view. The electronic module may be accommodated without increasing the peripheral area 1000NA, and therefore may improve the aesthetics of the electronic device 1000.

FIG. 3A is a schematic cross-sectional view of the electronic device according to an embodiment. FIG. 3B is a schematic cross-sectional view of an electronic device according to an embodiment.

Referring to FIG. 3A, the display panel 100 may be configured to generate an image and sense an input applied from the outside. For example, the display panel 100 may include a display layer 110 and a sensor layer 120.

The display layer 110 may be configured to substantially generate an image. The display layer 110 may be an emission-type display layer, for example, the display layer 110 may be an organic light emitting display layer, a quantum dot display layer, or a micro-LED display layer.

The display layer 110 may include a base layer 111, a circuit layer 112, a light emitting element layer 113, and an encapsulation layer 114.

The base layer 111 may include a synthetic resin film. The synthetic resin layer may include a thermosetting resin. The base layer 111 may have a multi-layered structure. For example, the base layer 111 may have a three-layered structure constituted by a synthetic resin layer, an adhesive layer, and a synthetic resin layer.

The synthetic resin layer may be a polyimide resin layer, but the material thereof is not particularly limited. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, and a perylene-based resin. The base layer 111 may include a glass substrate or an organic/inorganic composite substrate.

The circuit layer 112 may be disposed on the base layer 111. The circuit layer 112 may include an insulating layer, a semiconductor pattern, a conductive pattern, and a signal line. The insulating layer, the semiconductor layer, and the conductive layer may be formed on the base layer 111 by coating or vapor deposition. The insulating layer, the semiconductor layer, and the conductive layer may be selectively patterned through photolithography processes. Thereafter, the semiconductor pattern, the conductive pattern, and the signal line included in the circuit layer 112 may be formed.

A light emitting element layer 113 may be disposed on the circuit layer 112. The light emitting element layer 113 may include a light emitting element. For example, the light emitting element layer 113 may include an organic light emitting material, quantum dots, quantum rods, or micro-LEDs.

An encapsulation layer 114 may be disposed on the light emitting element layer 113. The encapsulation layer 114 may include an inorganic layer, an organic layer, and an inorganic layer, which are sequentially laminated, but layers constituting the encapsulation layer 114 are not limited thereto.

The inorganic layers may protect the light emitting element layer 113 against moisture and oxygen, and the organic layer may protect the light emitting element layer 113 against foreign substances such as dust particles. The inorganic layers may include a silicon nitride layer, a silicon oxy nitride layer, a silicon oxide layer, a titanium oxide layer, or an aluminum oxide layer. The organic layer may include an acrylic-based organic layer, but the embodiments are not limited thereto.

The sensor layer 120 may be disposed on the display layer 110. The sensor layer 120 may sense an external input applied from the outside. The external input may include various types of inputs provided from the outside of the electronic device 1000. For example, the external input may include an external input such as hovering that is applied at a distance to the electronic device 1000 as well as contact by a portion of the human body such as the user's hand. Also, the input may be provided in various forms such as force, a pressure, light, and the like and is not limited to any one embodiment.

The sensor layer 120 may be disposed on the display layer 110 through a continuous process. The sensor layer 120 may be directly disposed on the display layer 110 without a third component disposed between the sensor layer 120 and the display layer 110. A separate adhesive member may not be disposed between the sensor layer 120 and the display layer 110.

In another example, the sensor layer 120 may be bonded to the display layer 110 by an adhesive member. The adhesive member may include a common adhesive or an adhesive agent.

Referring to FIG. 3B, a display panel 100-1 may further include an anti-reflective layer 130 when compared with the display panel 100 described in FIG. 3A. An electronic device 1000 including the display panel 100-1 may not include the anti-reflective member 200 (refer to FIG. 4) and the third adhesive layer 1030 (refer to FIG. 4). Hereinafter, duplicated descriptions will be omitted.

The display panel 100-1 may include a display layer 110, a sensor layer 120, and an anti-reflective layer 130.

The anti-reflective layer 130 according to an embodiment may include color filters. The color filters may be arranged based on the emission colors of the pixels included in the display layer 110. Also, the anti-reflective layer 130 may further include a black matrix adjacent to the color filters.

The anti-reflective layer 130 according to an embodiment may include a destructive interference structure. For example, the destructive interference structure may include a first reflective layer and a second reflective layer, which are disposed on layers different from each other. The first reflected light and the second reflected light, which are respectively reflected from the first reflective layer and the second reflective layer, may destructively interfere with each other, and thus, the reflectance of external light may be reduced.

Figure 4:
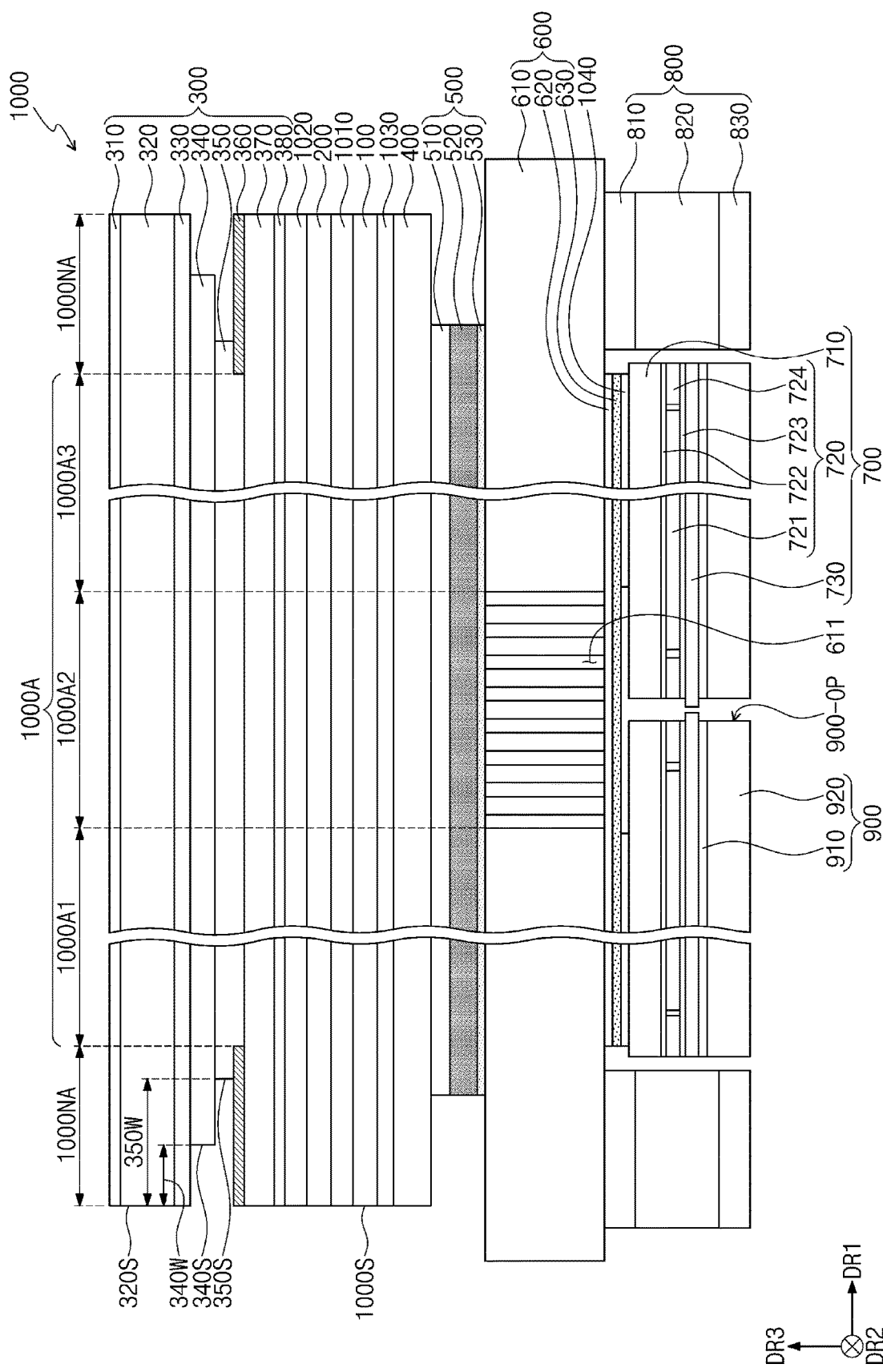
FIG. 4 is a schematic cross-sectional view of an electronic device according to an embodiment.

FIG. 4 is a schematic cross-sectional view of a display module according to an embodiment.

Referring to FIG. 4, the electronic device 1000 may include a display panel 100, upper functional layers, and lower functional layers. The upper functional layers may be disposed on the display panel 100. For example, the upper functional layers may include an anti-reflective member 200 and an upper member 300. The display panel 100 illustrated FIG. 4 may correspond to the display panels 100 and 100-1 described in FIGS. 3A and 3B.

The anti-reflective member 200 is disposed on the display panel 100. The anti-reflective member 200 may reduce reflectance of external light incident from the outside. The anti-reflective member 200 may include a stretched synthetic resin film. For example, the anti-reflective member 200 may be provided by dyeing an iodine compound on a polyvinyl alcohol film (PVA film). However, this is merely an example, and the material constituting the anti-reflective member 200 is not limited thereto.

The anti-reflective member 200 may be bonded to the display panel 100 through a first adhesive layer 1010. The first adhesive layer 1010 may be a transparent adhesive layer such as a pressure sensitive adhesive film (PSA), an optically clear adhesive film (OCA), or an optically clear resin (OCR). An adhesive layer described below may include the same material with the first adhesive layer 1010, or include a common adhesive or an adhesive agent.

In an embodiment, the first adhesive layer 1010 may be omitted. The anti-reflective member 200 may be directly disposed on the display panel 100. A separate adhesive layer may not be disposed between the anti-reflective member 200 and the display panel 100.

The upper member 300 may be disposed on the anti-reflective member 200. The upper member 300 includes a first hard coating layer 310, a protective layer 320, a first upper adhesive layer 330, a window 340, a second upper adhesive layer 350, a light blocking layer 360, an impact absorbing layer 370, and a second hard coating layer 380. The components included in the upper member 300 are not limited to the components described above. At least a portion of the above-described components may be omitted, and other components may be added.

The first hard coating layer 310 may be a layer disposed on the outermost surface of the electronic device 1000. The first hard coating layer 310 may be a functional layer for improving use characteristics of the electronic device 1000 and may be applied on the protective layer 320. For example, anti-fingerprint properties, anti-pollution properties, and anti-scratch properties may be improved by the first hard coating layer 310.

The protective layer 320 may be disposed below the first hard coating layer 310. The protective layer 320 may protect components disposed below the protective layer 320. The first hard coating layer 310, the anti-fingerprint layer, and the like may be additionally provided on the protective layer 320 to improve properties such as chemical resistance and abrasion resistance. The protective layer 320 may include a film having an elastic modulus of about 15 GPa or less at room temperature. In an embodiment, the protective layer 320 may be omitted.

The first upper adhesive layer 330 may be disposed below the protective layer 320. The protective layer 320 and the window 340 may be bonded to each other by the first upper adhesive layer 330.

The window 340 may be disposed below the first upper adhesive layer 330. The window 340 may include an optically transparent insulation material. For example, the window 340 may include a glass substrate or a synthetic resin film.

In case that the window 340 is a synthetic resin film, the window 340 may include a polyimide (PI) film or a polyethylene terephthalate (PET) film.

The window 340 may has a single layered structure or a multilayered structure. For example, the window 340 may include multiple plastic films bonded to each other by using an adhesive or include a glass substrate and a plastic film, which are bonded to each other by using an adhesive. The second upper adhesive layer 350 may be disposed below the window 340. The window 340 and the impact absorbing layer 370 may be bonded to each other by the second upper adhesive layer 340.

In an embodiment, a sidewall 340S of the window 340 and a sidewall 350S of the second upper adhesive layer 350 may be disposed inside sidewalls of other layers, for example, a sidewall 100S of the display panel 100 and a sidewall 320S of the protective layer 320. The inside disposition may mean that the active area 1000A is closer to other comparison objects.

A positional relationship between the layers may be changed by the folding operation of the electronic device 1000. According to an embodiment, since the sidewall 340S of the window 340 is disposed inside the sidewall 100S of the display panel 100 and the sidewall 320S of the protective layer 320, even though the positional relationship between the layers is changed, possibility that the sidewall 340S of the window 340 protrudes from the sidewall 320S of the protective layer 320 may be reduced. Thus, possibility that an external impact is transmitted through the sidewall 340S of the window 340 may be reduced. As a result, the probability that cracks occur in the window 340 may be reduced.

The window 340 and the second upper adhesive layer 350 may be bonded to the impact absorbing layer 370 through a lamination process. The window 340 and the second upper adhesive layer 350 may each have an area less than that of the impact absorbing layer 370 to allow for lamination process tolerances. The second upper adhesive layer 350 may have an area less than that of the window 340.

In case that the first upper adhesive layer 330 and the second upper adhesive layer 350 are attached to each other, the window 340 may not slip and may cause a buckling phenomenon to occur when the electronic device 1000 is folded. According to an embodiment, the second upper adhesive layer 350 may have an area less than that of the window 340. Thus, the first upper adhesive layer 330 is prevented from attaching to the second upper adhesive layer 350, and the probability of foreign substances adhering to the second upper adhesive layer 350 may be reduced as well.

The impact absorbing layer 370 may be a functional layer for protecting the display panel 100 from an external impact. The impact absorbing layer 370 may be selected from films having an elastic modulus of about 1 GPa or more at room temperature. The impact absorbing layer 370 may be a stretched film including an optical function. For example, the impact absorbing layer 370 may be an optical axis control film. For example, the impact absorbing layer 370 may be a biaxially stretched PET film.

The second hard coating layer 380 may be provided on a surface of the impact absorbing layer 370. The second hard coating layer 380 may include an organic coating agent, an inorganic coating agent, or an organic/inorganic mixed coating agent. The embodiments are not limited thereto, and may include any material that is capable of reducing haze.

Each of top and bottom surfaces of the impact absorbing layer 370 may include indentations. The top surface of the impact absorbing layer 370 may contact the second upper adhesive layer 350. Thus, any indentations on the top surface of the impact absorbing layer 370 may be filled by the second upper adhesive layer 350. Thus, an optical issue (e.g., an increase in haze) may not occur on the top surface of the impact absorbing layer 370.

The light blocking layer 360 may be provided by being printed on a top surface of the impact absorbing layer 370. The light blocking layer 360 may be disposed between the impact absorbing layer 370 and the second upper adhesive layer 350. The light blocking layer 360 may overlap the peripheral area 1000NA. The light blocking layer 360 may be a colored layer and may be formed by a coating process.

The light blocking layer 360 may include a polymer resin and a pigment mixed with the polymer resin. The polymer resin may be, for example, an acrylic resin or polyester, and the pigment may be a carbon-based pigment. However, the embodiments are not limited by the material forming the light blocking layer 360.

The upper member 300 may be bonded to the anti-reflective member 200 through the second adhesive layer 1020. The second adhesive layer 1020 may include a common adhesive or a sticking agent.

The lower functional layers may be disposed below the display panel 100. For example, the lower functional layers may include a lower protective film 400, an external light reflective member 500, a first lower member 600, second lower members 700, and a step compensation member 800. The first lower member 600 and the second lower members 700 may be referred to as lower members in an embodiment. In the embodiments, the components of the lower functional layers are not limited to the components described above. At least a portion of these components may be omitted, and other components may be added.

The lower protective film 400 may be bonded to a rear surface of the display panel 100 through the third adhesive layer 1030. The lower protective film 400 may prevent scratches from being generated in the rear surface of the display panel 100 during the process of manufacturing the display panel 100. The lower protective film 400 may be a colored polyimide film. For example, the lower protective film 400 may be an opaque yellow film, but the embodiments are not limited thereto.

The external light reflective member 500 may be disposed below the lower protective film 400. The external light reflective member 500 may have a color that may prevent the components disposed below the external light reflective member 500 from becoming visible to the user by incident light through the upper member 300.

The external light reflective member 500 may include a first barrier adhesive layer 510, a barrier film 520, and a second barrier adhesive layer 530. The first barrier adhesive layer 510 may be attached to the lower protective film 400, and the second barrier adhesive layer 530 may be attached to the first lower member 600.

The barrier film 520 may improve impact resistance performance. The barrier film 520 may prevent the display panel 100 from being deformed. The barrier film 520 may be a synthetic resin film, for example, a polyimide film, but the embodiments are not limited thereto.

A color of the external light reflective member 500 may be determined by the color of the material that was printed or sprayed on the barrier film 520. However, the embodiments are not limited thereto, and any material that absorbs light may be impregnated into the barrier film 520. The barrier film 520 may have a black color. However, the embodiments are not limited thereto and the barrier film 520 may have any color that may be capable of absorbing light.

The first lower member 600 may be disposed below the external light reflective member 500. The first lower member 600 may include a plate 610, a lower adhesive layer 620, and a cover layer 630. The embodiments are not limited to these components in the first lower member 600. At least a portion of these components may be omitted, and other components may be added.

The plate 610 may support components disposed on the upper side. Also, heat dissipation performance of the electronic device 1000 may be improved by the plate 610. The plate 610 may include a material having an elastic modulus of about 60 GPa or more at room temperature. For example, the plate 610 may include stainless steel. However, the embodiments are not limited to these materials for the plate 610. For example, the plate 610 may include an aluminum alloy.

A lower opening 611 may be defined in a portion of the plate 610. The lower opening 611 may overlap the second area 1000A2 and pass through the plate 610. For example, the lower opening 611 may overlap the second area 1000A2 in a plan view when viewed in the third direction DR3. When the display panel 100 is folded on the lower opening 611, a shape of the plate 610 overlapping the second area 1000A2 may accommodate the fold more easily.

The cover layer 630 may be attached to the plate 610 by the lower adhesive layer 620. The lower adhesive layer 620 may include a common adhesive or an adhesive agent. The cover layer 630 may cover the lower opening 611 of the plate 610 and may prevent foreign substances from entering the lower opening 611.

The second lower members 700 may be disposed below the first lower member 600. Multiple second lower members 700 may be spaced apart from each other. For example, one second lower member 700 may be disposed on the first area 1000A1 and the other second lower member 700 may be disposed on the third area 1000A3.

Each of the second lower members 700 may be attached to the first lower member 600 by fourth adhesive layers 1040. For example, a fourth adhesive layer 1040 may be attached to a bottom surface of the first lower member 600 overlapping the first area 1000A1, and another fourth adhesive layer 1040 may be attached to the bottom surface of the first lower member 600 overlapping the third area 1000A3. The fourth adhesive layers may not overlap the second area 1000A2 to expose a portion of the cover layer 630.

Each of the second lower members may include a lower plate 710, a heat dissipation sheet 720, and an insulating film 730. The embodiments are not limited to these components included in the second lower members 700. At least a portion of these components may be omitted, and other components may be added.

There may be multiple lower plates 710. A lower plate may be disposed to overlap the first area 1000A1 and a portion of the second area 1000A2, and another lower plate 710 may overlap the other portion of the second area 1000A2 and the third area 1000A3.

The lower plates 710 may be disposed to be spaced apart from each other in the second area 1000A2. However, the lower plates 710 may be disposed as close together as possible to support the area in which the lower opening 611 of the plate 610 is defined. For example, the lower plates 710 may prevent the plate 610 from being deformed in the area where the lower opening 611 is defined due to pressure applied from the upper portion.

Also, the lower plates 710 may serve to prevent the components disposed above the second lower members 700 from being deformed by the components disposed below the second lower members 700.

Each of the lower plates 710 may include a metal alloy. For example, each of the lower plates 710 may include a copper alloy. However, the embodiments are not limited by the material forming the lower plates 710.

The heat dissipation sheets 720 may be attached to the lower portion of the lower plates 710. The heat dissipation sheet may be a thermal conductive sheet having high thermal conductivity. For example, the heat dissipation sheets 720 may include a heat dissipation layer 721, a first heat dissipation adhesive layer 722, a second heat dissipation adhesive layer 723, and a gap tape 724.

The gap tape 724 may be attached to the first heat dissipation adhesive layer 722 and the second heat dissipation adhesive layer 723, which are spaced apart from each other, with the heat dissipation layer 721 therebetween. The gap tape 724 may be provided as multiple layers. For example, the gap tape 724 may include a base layer, an upper adhesive layer disposed on a top surface of the base layer, and a lower adhesive layer disposed on a bottom surface of the base layer.

The heat dissipation layer 721 may be attached to the lower plate 710 by the first heat dissipation adhesive layer 722. The heat dissipation layer 721 may be sealed by the first heat dissipation adhesive layer 722, the second heat dissipation adhesive layer 723, and the gap tape 724. The heat dissipation layer 721 may be a graphitized polymer film. The polymer film may be, for example, a polyimide film.

The insulating film 730 may be attached to a lower portion of the heat dissipation sheet 720. For example, the insulating film 730 may be attached to the second heat dissipation adhesive layer 723. Rattling of the electronic device 1000 may be prevented by the insulating film 730. The insulating film 730 may have a thickness of about 15 micrometers, but the embodiments are not limited thereto.

The step compensation member 800 may be attached to the lower portion of the plate 610. For example, the lower adhesive layer 620 may be attached to the lower side of a portion of the plate 610, and the step compensation member 800 may be attached to the lower side of another portion of the plate 610. The step compensation member 800 may include a first compensation adhesive layer 810, a step compensation film 820, and a second compensation adhesive layer 830. The first compensation adhesive layer 810 may be attached to the bottom surface of the plate 610. The step compensation film 820 may be a synthetic resin film. The second compensation adhesive layer 830 may be attached to a bottom surface of the step compensation film 820 and a set (not shown).

The step compensation member 800 may compensate for height differences which occur below the plate 610 due to the thicknesses of the lower members 700 and cushion members 900 which are attached to a portion of the plate 610. Thus, the display panel 100 may be attached to a set (not shown) with the rear surface of the display panel 100 planarized.

The cushion members 900 may be disposed below the lower members 700. Multiple cushion members 900 may be provided and each may be disposed under a corresponding lower member 700. For example, a cushion member may be disposed below the lower member 700 disposed at the left side in a cross-section, and the other may be disposed below the lower member 700 disposed at the right side in a cross-section. The cushion members 900 may be spaced apart from each other on the second area 1000A2 to define a cushion hole 900-OP.

According to an embodiment, since the cushion members 900 are defined to be spaced apart from each other and include the cushion hole 900-OP overlapping the second area 1000A2, stress applied when the display panel 100 is folded may be reduced.

Also, the cushion members 900 may protect the display panel 100 from an impact transmitted from the lower portion. The cushion members 900 may include, for example, a foam material or sponge. The foam material may include polyurethane foam or thermoplastic polyurethane foam. In case that the cushion members 900 include foam, a barrier film may be added as a base layer in the cushion members 900, and a foaming agent may be foamed on the barrier film to form the cushion members 900.

According to an embodiment, as the rigid lower member is disposed adjacent to the lower portion of the display panel 100, the rigidity of the electronic device 1000 may be improved compared to when a cushion member 900 is disposed on the display panel 100. Also, as the material absorbing light is disposed between the display panel 100 and the lower member, visibility may be improved, and impact resistance of the electronic device 1000 may be improved by disposing the cushion members 900 at the outermost side.

Figure 5:
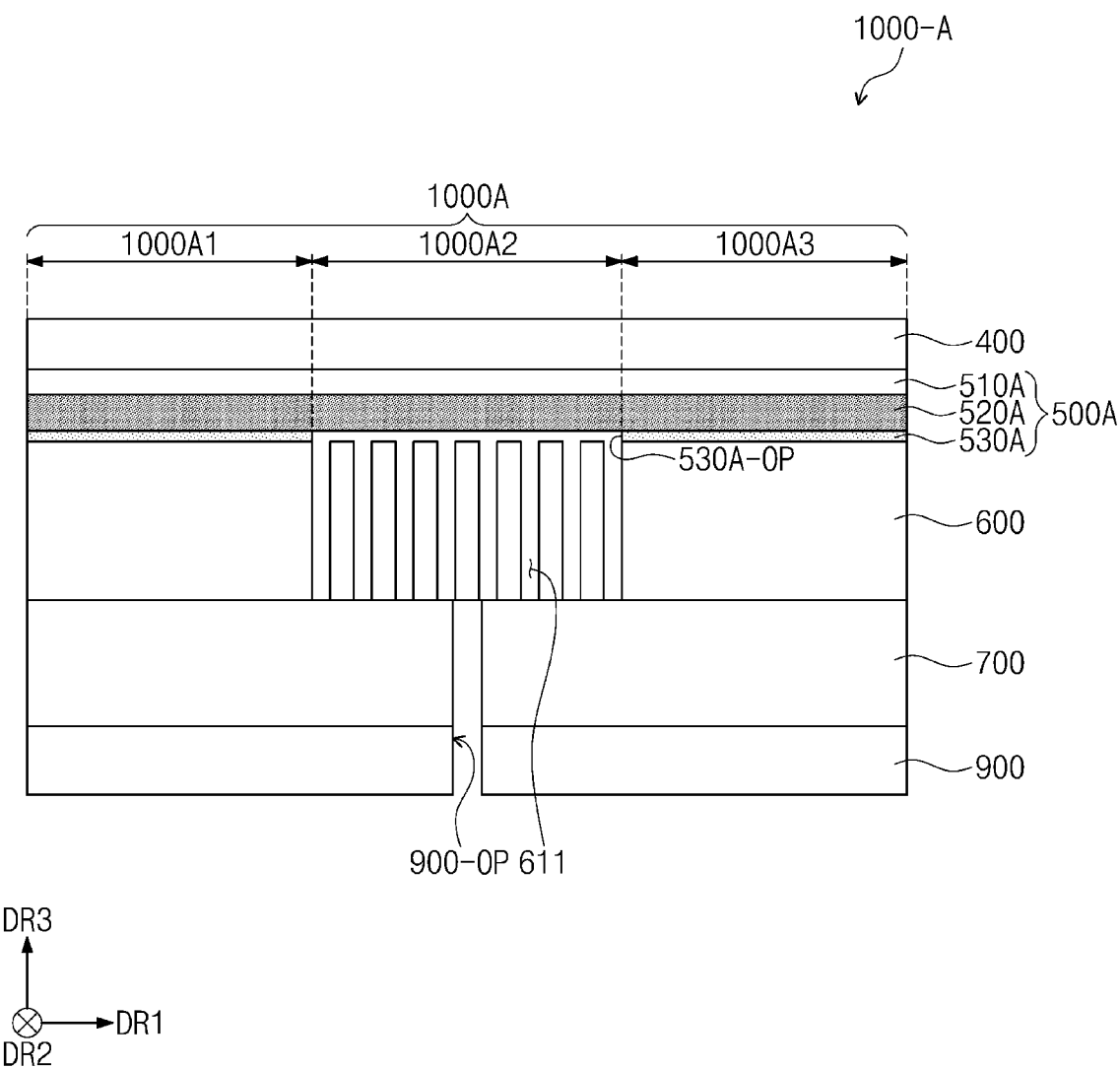
FIG. 5 is a schematic cross-sectional view of an electronic device according to an embodiment.
Figure 6:
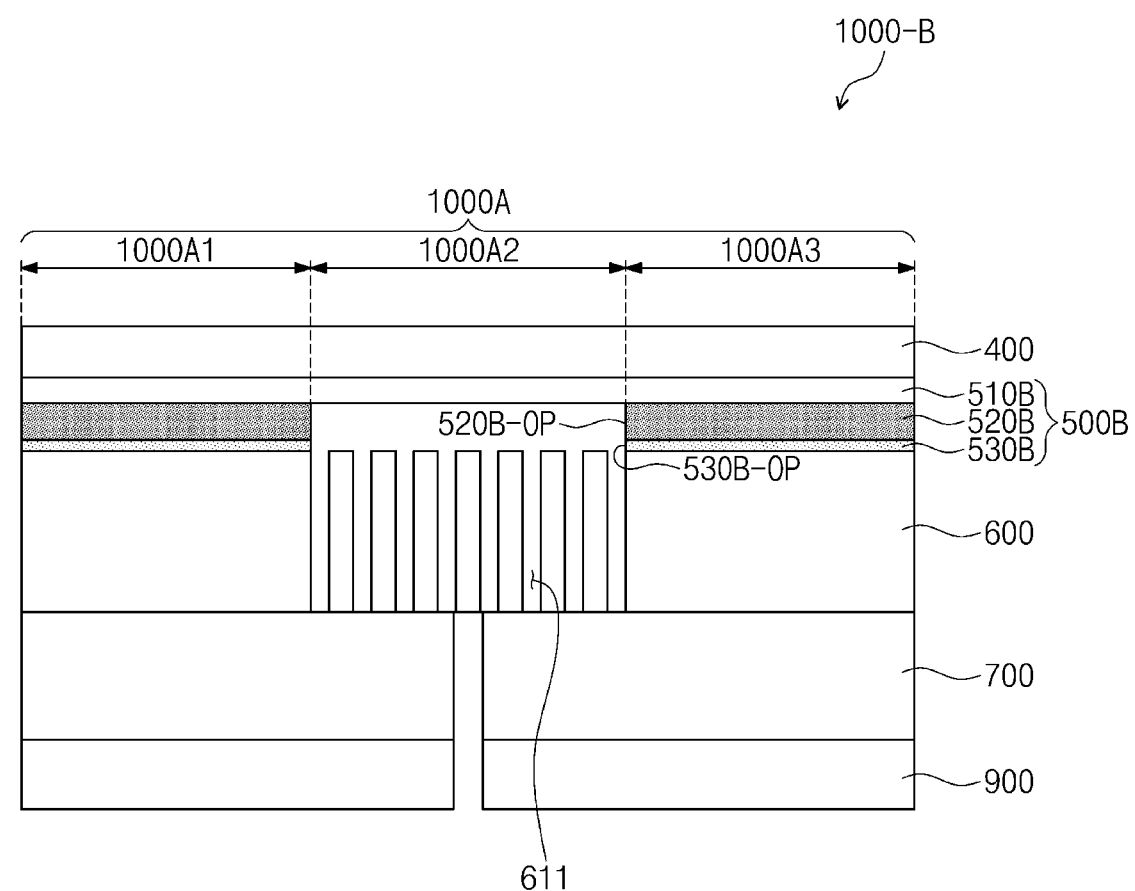
FIG. 6 is a schematic cross-sectional view of an electronic device according to an embodiment.
Figure 7:
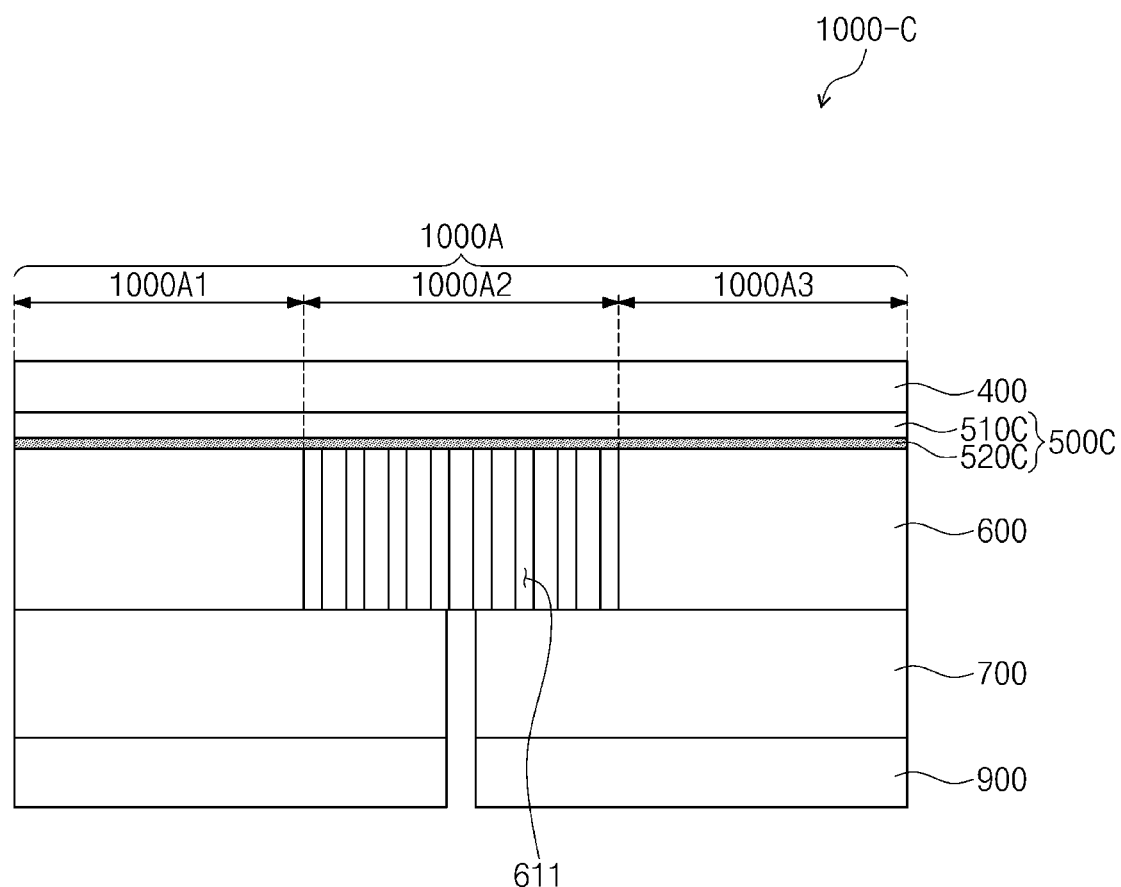
FIG. 7 is a schematic cross-sectional view of an electronic device according to an embodiment.
Figure 8:
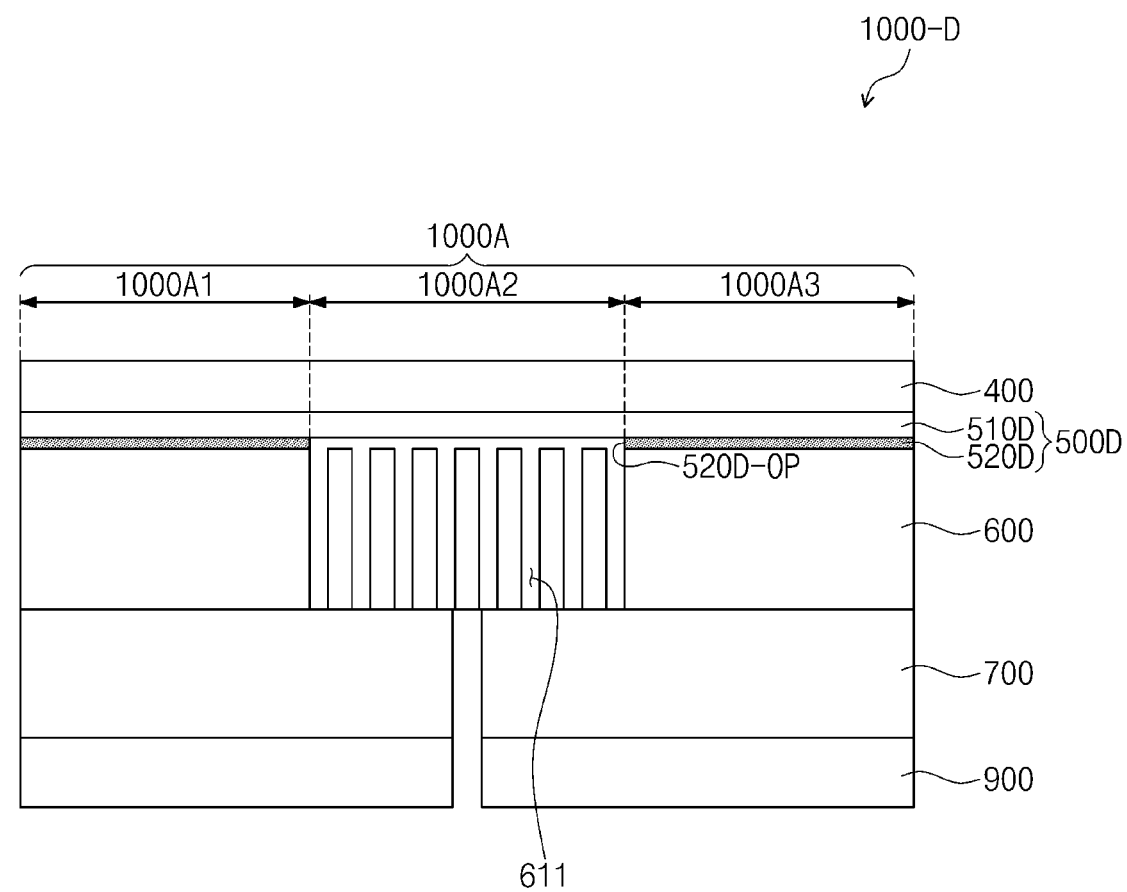
FIG. 8 is a schematic cross-sectional view of an electronic device according to an embodiment.
Figure 9:
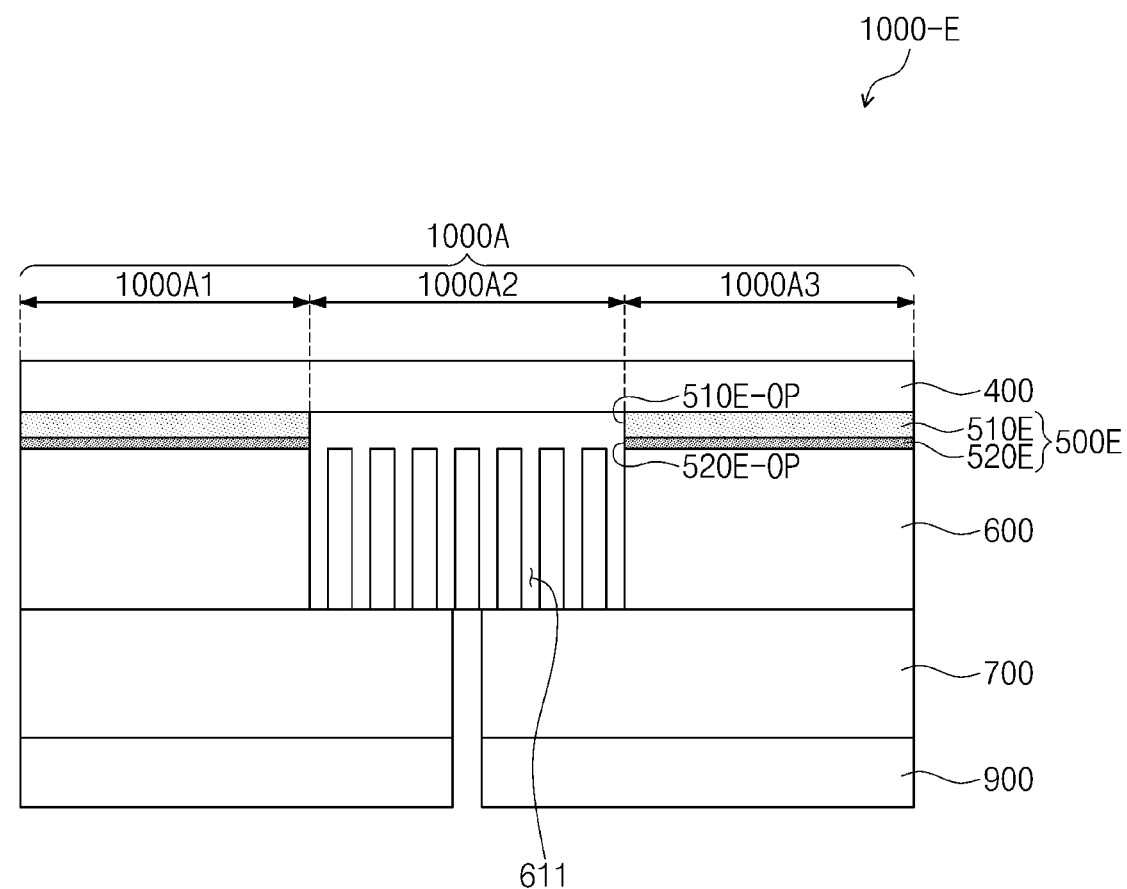
FIG. 9 is a schematic cross-sectional view of an electronic device according to an embodiment.

FIG. 5 is a schematic cross-sectional view of a display module according to an embodiment. FIG. 6 is a schematic cross-sectional view of the electronic device according to an embodiment. FIG. 7 is a schematic cross-sectional view of the electronic device according to an embodiment. FIG. 8 is a schematic cross-sectional view of the electronic device according to an embodiment. FIG. 9 is a schematic cross-sectional view of a display module according to an embodiment.

Hereinafter, electronic devices to be described in FIGS. 5 to 9 use the same/similar reference numerals for the same/similar configurations as those of the electronic device described in FIG. 4, and also, duplicated description will be omitted. In FIGS. 5 to 9, the display panel 100, the anti-reflective member 200, the upper member 300, and the adhesive layers, which are described in FIG. 4, are omitted, and only components overlapping the active area 1000A are illustrated.

Referring to FIG. 5, an external light reflective member 500A of an electronic device 1000-A according to an embodiment may include a first barrier adhesive layer 510A, a barrier film 520A, and a second barrier adhesive layer 530A. The first barrier adhesive layer 510A may be disposed between the lower protective film 400 and the barrier film 520A to bond the lower protective film 400 to the barrier film 520A, and the second barrier adhesive layer 530A may be disposed between the first lower member 600 and the barrier film 520A to bond the first lower member 600 to the barrier film 520A.

In an embodiment, an adhesive opening 530A-OP may be defined in the second barrier adhesive layer 530A. The adhesive opening 530A-OP may overlap the second area 1000A2. The adhesive opening 530A-OP may be defined as penetrating the second barrier adhesive layer 530A in the third direction DR3. A portion of a lower surface of the barrier film 520A may be exposed by the adhesive opening 530A-OP.

According to an embodiment, since the display panel 100 includes the adhesive opening 530A-OP overlapping the second area 1000A2 that is the folded area, in case that the electronic device 1000-A is folded, the first lower member 600 overlapping the second area 1000A2 may be more easily accommodate the folding, and stress applied to the second barrier adhesive layer 530A may be reduced.

Referring to FIG. 6, an external light reflective member 500B of an electronic device 1000-B according to an embodiment may include a first barrier adhesive layer 510B, a barrier film 520B, and a second barrier adhesive layer 530B. The first barrier adhesive layer 510B may be disposed between the lower protective film 400 and the barrier film 520B to bond the lower protective film 400 to the barrier film 520B, and the second barrier adhesive layer 530B may be disposed between the first lower member 600 and the barrier film 520B to bond the first lower member 600 to the barrier film 520B.

In this embodiment, an adhesive opening 530B-OP may be defined in the second barrier adhesive layer 530B. The adhesive opening 530B-OP may overlap the second area 1000A2. The adhesive opening 530B-OP may be defined as penetrating the second barrier adhesive layer 530B in the third direction DR3.

A film opening 520B-OP may be defined in the barrier film 520B. The film opening 520B-OP may overlap the second area 1000A2. Thus, the film opening 520B-OP may overlap the adhesive opening 530B-OP. A portion of a lower surface of the first barrier adhesive layer 510B may be exposed by the film opening 520B-OP and the adhesive opening 530B-OP.

In this embodiment, side surfaces of the second barrier adhesive layer 530B and the barrier film 520B, which respectively define the adhesive opening 530B-OP and the film opening 520B-OP, are illustrated as being aligned, but the embodiments are not limited thereto.

According to an embodiment, since the display panel 100 includes the film opening 520B-OP and the adhesive opening 530B-OP overlapping the second area 1000A2 that is the folded area, in case that the electronic device 1000-B is folded, the first lower member 600 overlapping the second area 1000A2 may more easily accommodate the folding, and stress applied to the barrier film 520B and the second barrier adhesive layer 530B may be reduced.

Referring to FIG. 7, an external light reflective member 500C of an electronic device 1000-C according to an embodiment may include an adhesive layer 510C and a base layer 520C. The adhesive layer 510C may be disposed between a lower protective film 400 and the base layer 520C to bond the lower protective film 400 to the base layer 520C.

In this embodiment, the base layer 520C may cover substantially the entire surface of a first lower member 600. The base layer 520C may be formed on the first lower member 600 through a coating process. For example, the base layer 520C may be formed on the first lower member 600 through aluminum anodizing or may be formed on the first lower member 600 through a spray method or a vapor deposition method.

In this embodiment, as the base layer 520C is disposed directly on the first lower member 600 and includes aluminum, the first lower member 600 may increase in rigidity and corrosion resistance. The base layer 520C may have a black color which may prevent the components disposed below an external light reflective member 500-C from becoming visible to the user by incident light through the upper member 300.

Referring to FIG. 8, an external light reflective member 500D of an electronic device 1000-D according to an embodiment may include an adhesive layer 510D and a base layer 520D. The adhesive layer 510D may be disposed between a lower protective film 400 and the base layer 520D to bond the lower protective film 400 to the base layer 520D.

In this embodiment, the base layer 520D may cover substantially the entire surface of a first lower member 600. The base layer 520D may be formed on the first lower member 600 through a coating process.

In this embodiment, a film opening 520D-OP may be defined in the base layer 520D. The film opening 520D-OP may overlap a second area 1000A2. The film opening 520D-OP may be defined as penetrating the base layer 520D in the third direction DR3. A portion of a bottom surface of the adhesive layer 510D may be exposed through the film openings 520D-OP.

According to this embodiment, since the display panel 100 includes the film opening 520D-OP overlapping the second area 1000A2 that is the folded area, in case that the electronic device 1000-D is folded the first lower member 600 overlapping the second area 1000A2 may more easily accommodate the folding, and stress applied to the base layer 520D may be reduced.

Referring to FIG. 9, an external light reflective member 500E of an electronic device 1000-E according to an embodiment may include an adhesive layer 510E and a base layer 520E. The adhesive layer 510E may be disposed between a lower protective film 400 and the base layer 520E to bond the lower protective film 400 to the base layer 520E.

In this embodiment, the base layer 520E may cover substantially the entire surface of a first lower member 600. The base layer 520E may be formed on the first lower member 600 through a coating process.

In this embodiment, a film opening 520E-OP may be defined in the base layer 520E. The film opening 520E-OP may overlap the second area 1000A2. The film opening 520E-OP may be defined as penetrating the base layer 520E in the third direction DR3.

An adhesive opening 510E-OP may be defined in the adhesive layer 510E. The adhesive opening 510E-OP may overlap the second area 1000A2. Thus, the adhesive opening 510E-OP may overlap the film opening 520E-OP. A portion of a lower surface of the lower protective film 400 may be exposed by the film opening 520E-OP and the adhesive opening 510E-OP.

According to this embodiment, since the display panel 100 includes the film opening 520E-OP overlapping the second area 1000A2 that is the folded area and the adhesive opening 510E-OP, in case that electronic device 1000-E is folded, the first lower member 600 overlapping the second area 1000A2 may more easily accommodate the folding, and stress applied to the external light reflective member 500E may be reduced.

According to an embodiment, a rigid lower member may be disposed adjacent to the lower portion of the display panel to improve the rigidity of the electronic device. In addition, the light absorbing material may be disposed between the display panel and the lower member to improve the visibility of the electronic device.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. An electronic device comprising:
   a display panel comprising non-folding areas and a folding area disposed between the non-folding areas, the display panel being foldable along a folding axis;
   a lower protective film disposed below the display panel;
   an external light reflective member disposed below the lower protective film;
   a lower member disposed below the external light reflective member; and
   cushion members disposed below the lower member and extending from the non-folding areas into the folding area;

wherein the cushion members are spaced apart from each other and define a cushion hole in the folding area, and
the lower member overlapping the folding area is exposed from the cushion members through the cushion hole.

2. The electronic device of claim 1, wherein the external light reflective member has a black color.

3. The electronic device of claim 1, wherein the external light reflective member comprises:
a barrier film disposed on the lower member;
a first barrier adhesive layer disposed between the barrier film and the lower protective film to bond the barrier film to the lower protective film; and
a second barrier adhesive layer disposed between the barrier film and the lower member to bond the barrier film to the lower member.

4. The electronic device of claim 3, further comprising an adhesive opening which overlaps the folding area and passes through the second barrier adhesive layer.

5. The electronic device of claim 4, further comprising a film opening which overlaps the adhesive opening and passes through the barrier film.

6. The electronic device of claim 1, wherein the external light reflective member comprises:
a base layer that overlaps the lower member and comprises aluminum; and
an adhesive layer disposed between the base layer and the lower protective film to bond the base layer to the lower protective film.

7. The electronic device of claim 6, further comprising a base opening which overlaps the folding area and passes through the base layer.

8. The electronic device of claim 7, further comprising an adhesive opening which overlaps the base opening and passes through the adhesive layer.

9. The electronic device of claim 1, wherein
the lower member comprises:
a first lower member disposed below the external light reflective member and comprising at least one of stainless steel and an aluminum alloy; and
a second lower member disposed between the cushion members and the first lower member, and
at least one lower opening overlaps the folding area and passes through the first lower member.

10. The electronic device of claim 9, wherein
the second lower member comprises at least one of a lower plate, a heat dissipation sheet, and an insulating film, and
the lower plate prevents the at least one lower opening from being deformed.

11. An electronic device comprising:
a display panel comprising a first area, a second area, and a third area, which are arranged in a first direction;
a lower protective film disposed below the display panel;
a lower member disposed below the display panel;
first and second cushion members disposed below the lower member; and
an external light reflective member disposed between the lower protective film and the lower member, wherein
the first and third areas are non-foldable and the second area is foldable along a folding axis extending in a second direction intersecting the first direction,
the external light reflective member has a black color, and
the first and second cushion members are spaced apart from each other and the first cushion member extending from the first area into the second area, the second cushion member extending from the third area into the second area, the first and second cushion members defining a cushion hole in the second area, and
the lower member overlapping the second area is exposed from the first and second cushion members through the cushion hole.

12. The electronic device of claim 11, wherein the external light reflective member comprises:
a barrier film disposed on the lower member;
a first barrier adhesive layer disposed between the barrier film and the lower protective film to bond the barrier film to the lower protective film; and
a second barrier adhesive layer disposed between the barrier film and the lower member to bond the barrier film to the lower member.

13. The electronic device of claim 12, further comprising an adhesive opening which overlaps the second area and passes through the second barrier adhesive layer.

14. The electronic device of claim 13, further comprising a film opening which overlaps the adhesive opening and passes through the barrier film.

15. The electronic device of claim 11, wherein the external light reflective member comprises:
a base layer that overlaps the lower member and comprises aluminum; and
an adhesive layer disposed between the base layer and the lower protective film to bond the barrier film to the lower protective film.

16. The electronic device of claim 15, further comprising a base opening which overlaps the second area and passes through the base layer.

17. The electronic device of claim 16, further comprising an adhesive opening which overlaps the base opening and passes through the adhesive layer.

18. The electronic device of claim 11, wherein
the lower member comprises:
a first lower member disposed below the external light reflective member and comprising at least one of stainless steel and aluminum; and
a second lower member disposed between the first and second cushion members and the first lower member, and
at least one lower opening overlaps the second area and passes through the first lower member.

19. The electronic device of claim 18, wherein
the second lower member comprises at least one of a lower plate, a heat dissipation sheet, and an insulating film, and
the lower plate prevents the at least one lower opening from being deformed.

20. The electronic device of claim 1, wherein
the lower member comprises a plurality of lower openings extending completely through the lower member in a thickness direction and spaced apart from each other in a first direction different from the thickness direction, the lower openings in a plan view overlapping the folding area;
a first portion of the lower member between a first group of the lower openings overlaps the cushion hole in a plan view; and
a second portion of the lower member between a second group of the lower openings overlaps the folding area and does not overlap the cushion hole in a plan view.

21. The electronic device of claim 20, wherein the external light reflective member comprises a second opening overlapping the folding area and the lower openings in a plan view, the second opening extending to each of the non-folding areas in the first direction.

22. The electronic device of claim 1, wherein the lower member comprises a first layer that extends from the non-folding areas into the folding area, the first layer of the lower member comprising in the folding area a second hole extending completely through the first layer in a thickness direction and overlapping within the first and second vertical surfaces of the cushion hole and smaller than the cushion hole.

23. The electronic device of claim 22, wherein the lower member further comprises a second layer that extends from the non-folding areas into the folding area, the second layer comprising a third hole having third and fourth vertical surfaces extending completely through the second layer in a thickness direction and coplanar with the respective first and second vertical surfaces of the cushion hole, the second hole between the cushion hole and the third hole in a thickness direction and the second hole smaller than the third hole.

\* \* \* \* \*